United States Patent
Fenzi et al.

(10) Patent No.: US 11,632,096 B2
(45) Date of Patent: *Apr. 18, 2023

(54) TRANSVERSELY-EXCITED FILM BULK ACOUSTIC RESONATOR COMPRISING SMALL CELLS

(71) Applicant: MURATA MANUFACTURING CO., LTD., Kyoto (JP)

(72) Inventors: Neal Fenzi, Santa Barbara, CA (US); Ryo Wakabayashi, Santa Clara, CA (US); Bryant Garcia, Belmont, CA (US); Greg Dyer, Santa Barbara, CA (US)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/542,300

(22) Filed: Dec. 3, 2021

(65) Prior Publication Data

US 2022/0094329 A1    Mar. 24, 2022

Related U.S. Application Data

(63) Continuation of application No. 17/342,544, filed on Jun. 9, 2021, now Pat. No. 11,264,969.

(60) Provisional application No. 63/078,886, filed on Sep. 15, 2020, provisional application No. 63/067,330, filed on Aug. 19, 2020, provisional application No. 63/062,395, filed on Aug. 6, 2020.

(51) Int. Cl.
*H03H 9/13*    (2006.01)
*H03H 9/24*    (2006.01)
*H05K 7/20*    (2006.01)

(52) U.S. Cl.
CPC .......... *H03H 9/13* (2013.01); *H03H 9/2405* (2013.01); *H05K 7/2039* (2013.01)

(58) Field of Classification Search
CPC ....... H03H 9/13; H03H 9/2405; H05K 7/2039
See application file for complete search history.

(56) References Cited

U.S. PATENT DOCUMENTS

| | | | |
|---|---|---|---|
| 5,274,345 A | * | 12/1993 | Gau ............... H03H 9/02842 29/25.35 |
| 5,446,330 A | | 8/1995 | Eda et al. |
| 5,552,655 A | | 9/1996 | Stokes et al. |
| 5,726,610 A | | 3/1998 | Allen et al. |
| 5,853,601 A | | 12/1998 | Krishaswamy |

(Continued)

FOREIGN PATENT DOCUMENTS

| WO | 2016017104 | 2/2016 |
|---|---|---|
| WO | 2018003273 | 1/2018 |

OTHER PUBLICATIONS

Buchanan "Ceramic Materials for Electronics" 3rd Edition, first published in 2004 by Marcel Dekker, Inc. pp. 496 (Year 2004). Jan. 00, 2004.

(Continued)

*Primary Examiner* — Jeffrey M Shin
(74) *Attorney, Agent, or Firm* — ArentFox Schiff LLP

(57) ABSTRACT

Acoustic resonator devices are disclosed. An acoustic resonator device includes a plurality of cells electrically connected in parallel. Each cell includes an interdigital transducer (IDT) on a piezoelectric plate, the IDT having at least 15 and not more than 35 interleaved fingers.

26 Claims, 12 Drawing Sheets

(56) References Cited

U.S. PATENT DOCUMENTS

| | | |
|---|---|---|
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,264,969 B1* | 3/2022 | Fenzi .................. H03H 9/13 |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda et al. |
| 2019/0379351 A1 | 12/2019 | Miyamoto et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1* | 8/2020 | Pensala .............. H03H 9/02228 |
| 2020/0313645 A1* | 10/2020 | Caron .................. H03H 9/0576 |
| 2020/0350891 A1 | 11/2020 | Turner |
| 2021/0013859 A1 | 1/2021 | Turner et al. |
| 2021/0328574 A1 | 10/2021 | Garcia |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 00, 2015

(56) References Cited

OTHER PUBLICATIONS

Zou, Jie "High-Performance Aluminum Nitride Lamb Wave Resonators for RF Front-End Technology" University of California, Berkeley, Summer 2015, pp. 63 (Year 2015) Jan. 00, 2015.
Santosh, G. , Surface acoustic wave devices on silicon using patterned and thin film ZnO, Ph.D. thesis, reb 2016, Indian Institute of technology Guwahati, Assam, India Feb. 2016.
Merriam Webster, dictionary meaning of the word "diaphragm", since 1828, Merriam Webster (Year: 1828) 1828.
Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 TIBTECH innovations (Year 2018). 2018.
USPTO/ISA, International Search Report and Written Opinion for PC Application No. PCT/US2020/45654 dated Oct. 29, 2020.
T. Takai, H. Iwamoto, et al., "I.H.P.Saw Technology and its Application to Microacoustic Components (Invited)." 2017 IEEE international Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators Wth High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for improved Sensitivity." Doctoral dissertation, University of South Florida, USA, Jan. 2012, 7 pages.
Ekeom, D. & Dubus, Bertrand & Volatler, A . . . (2006). Solidly mounted resonator (SMR) FEM-BEM simulation. 1474-1477. 10.1109/ULTSYM.2006.371.
Mizutani, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi: 0.1002/ecja.4410690406.
Naumenko et al., "Optimal orientations of Lithium Niobate for resonator SAW filters", 2003 IEEE Ultrasonics Symposium—pp. 2110-2113. (Year: 2003).
Namdeo et al. "Simulation on Effects of Electrical Loading due to Interdigitai Transducers in Surface Acoustic Wave Resonator", published in Procedia Engineering 64 (2013) of Science Direct pp. 322-330 (Year: 2013) 2013.
Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020, Sep. 2020.
USPTO/ISA, International Search Report and Written Opinion for PCT Application No. PCT/US2021/024824 dated Jul. 27, 2021, 9 total pages.

\* cited by examiner

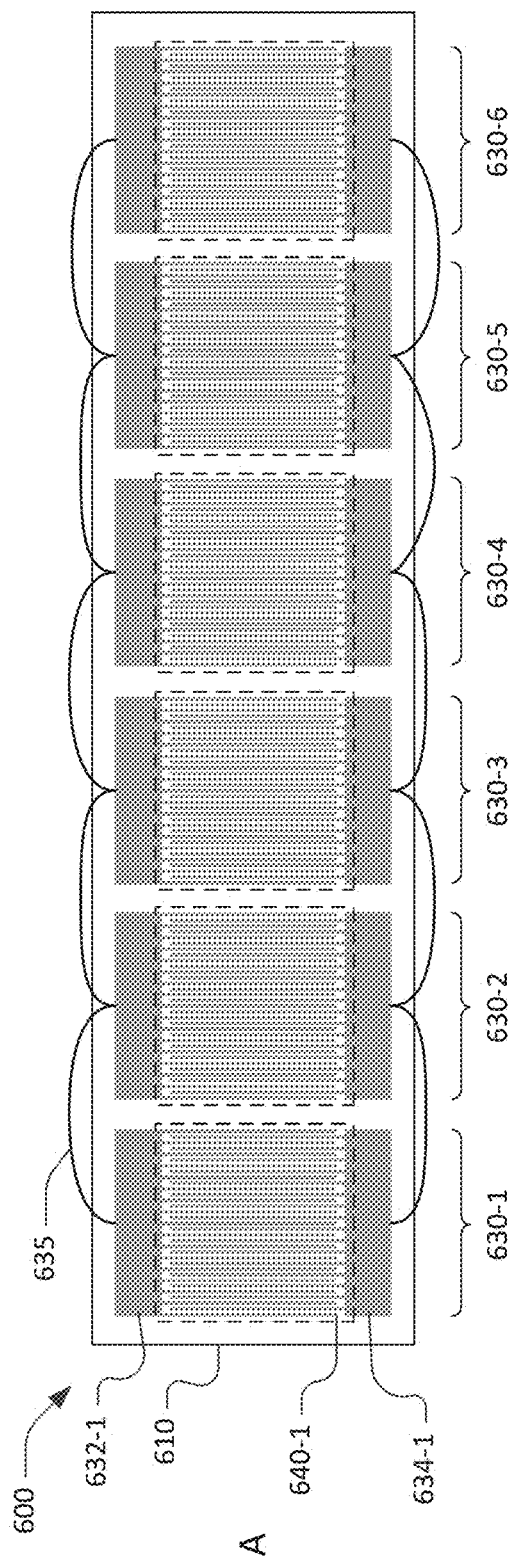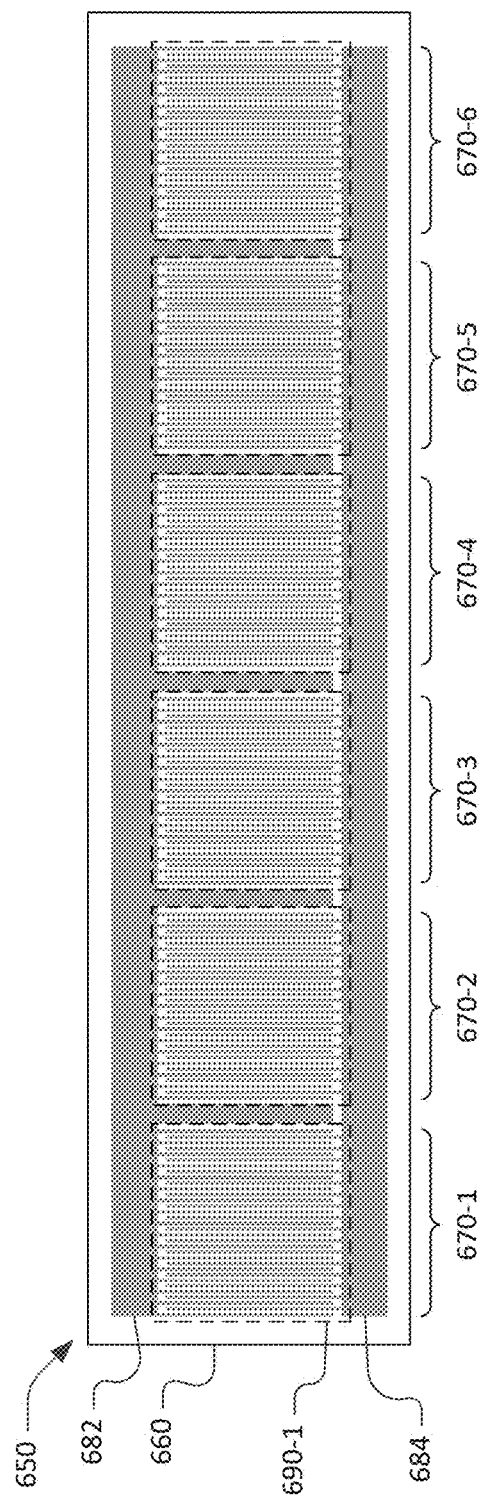

TRANSVERSELY-EXCITED FILM BULK ACOUSTIC RESONATOR COMPRISING SMALL CELLS

RELATED APPLICATION INFORMATION

This patent is a continuation of application Ser. No. 17/342,544, filed Jun. 9, 2021, entitled TRANSVERSELY-EXCITED FILM BULK ACOUSTIC RESONATOR COMPRISING SMALL CELLS which claims priority to the following provisional patent applications: Application No. 63/062,395, filed Aug. 6, 2020, entitled SMALL LOW SPURIOUS UNIT CELL TO CONSTRUCT XBAR RESONATORS; Application No. 63/067,330, filed Aug. 19, 2020, entitled SMALL LOW SPURIOUS UNIT CELL TO CONSTRUCT XBAR RESONATORS; and Application No. 63/078,886, filed Sep. 15, 2020, entitled XBAR USING SMALLEST GOOD RESONATOR CELLS.

This patent is related to application Ser. No. 17/229,767, filed Apr. 13, 2021, entitled SMALL TRANSVERSELY-EXCITED FILM BULK ACOUSTIC RESONATORS WITH ENHANCED Q-FACTOR.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 6A is a plan view of an XBAR composed of six cells, each having 33 IDT fingers.

FIG. 6B is a plan view of another XBAR composed of six cells, each having 33 IDT fingers.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
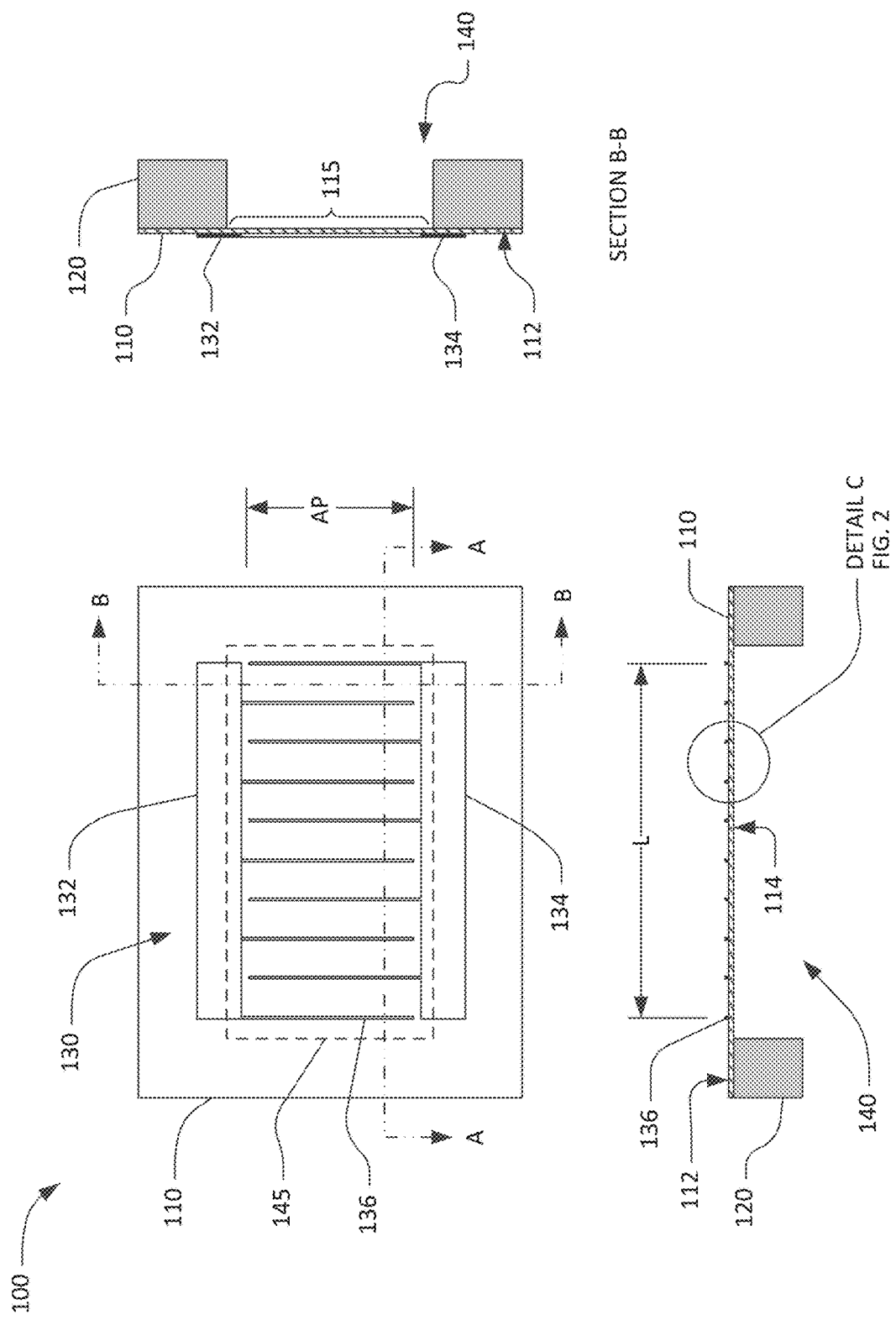
FIG. 1 is schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be, for example, Z-cut, rotated ZY-cut and rotated YX-cut.

The back surface 114 of the piezoelectric plate 110 is attached to a surface of the substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have dozens, possibly hundreds, of parallel fingers in the IDT 110. Similarly, the thickness of the piezoelectric plate and IDT fingers are greatly exaggerated in the cross-sectional views.

Figure 2:
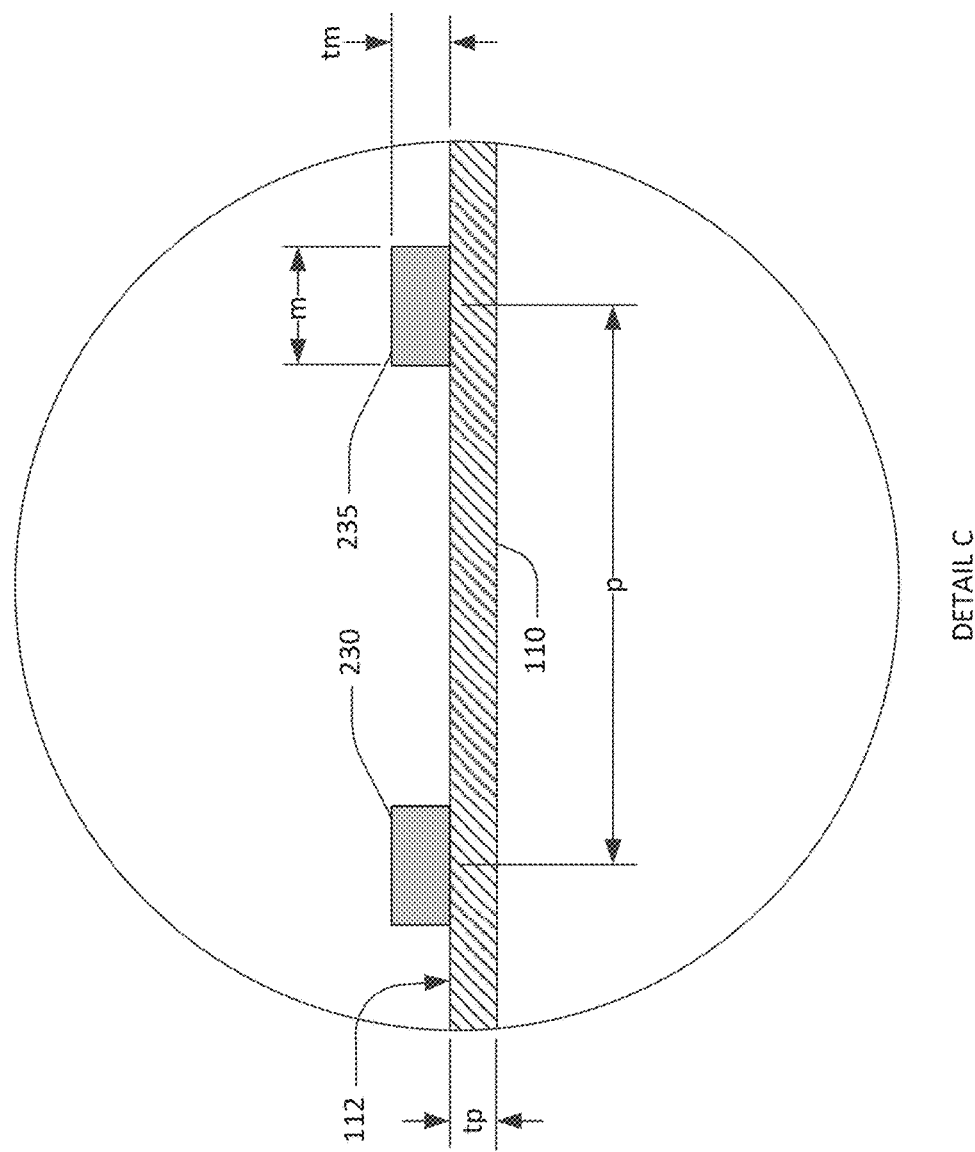
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness tp. tp may be, for example, 100 nm to 1500 nm. When used in filters for communications bands from 3.4 GHZ to 6 GHz, the thickness tp may be, for example, 200 nm to 1000 nm.

The IDT fingers 230, 235 may be one or more layers of aluminum, a substantially aluminum alloy, copper, a substantially copper alloy, beryllium, gold, molybdenum, or some other conductive material. Thin (relative to the total thickness of the conductors) layers of other metals, such as chromium or titanium, may be formed under and/or over the fingers 230, 235 to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width m of the fingers. In addition, the pitch p of the IDT is typically 2 to 20 times the thickness tp of the piezoelectric plate 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography.

The thickness tm of the IDT fingers 230, 235 may be from 100 nm to about equal to the width m. The thickness of the busbars (132, 134 in FIG. 1) of the IDT may be the same as, or greater than, the thickness tm of the IDT fingers. For XBARs intended for high power applications, the thickness tm may be greater than 0.85 times the thickness tp of the piezoelectric plate 110, as described in U.S. Pat. No. 10,637, 438.

As shown in FIG. 2, the IDT fingers 230, 235 have rectangular cross-sections. The IDT fingers 230, 235 may have some other cross-section, such as trapezoidal, T-shaped, or stepped. The IDT fingers 230, 235 are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be disposed between the IDT fingers 230, 235 and the piezoelectric plate 110. Although not shown in FIG. 2, some or all IDT fingers may be disposed in grooves or slots extending part way through the piezoelectric plate 110.

Figure 3:
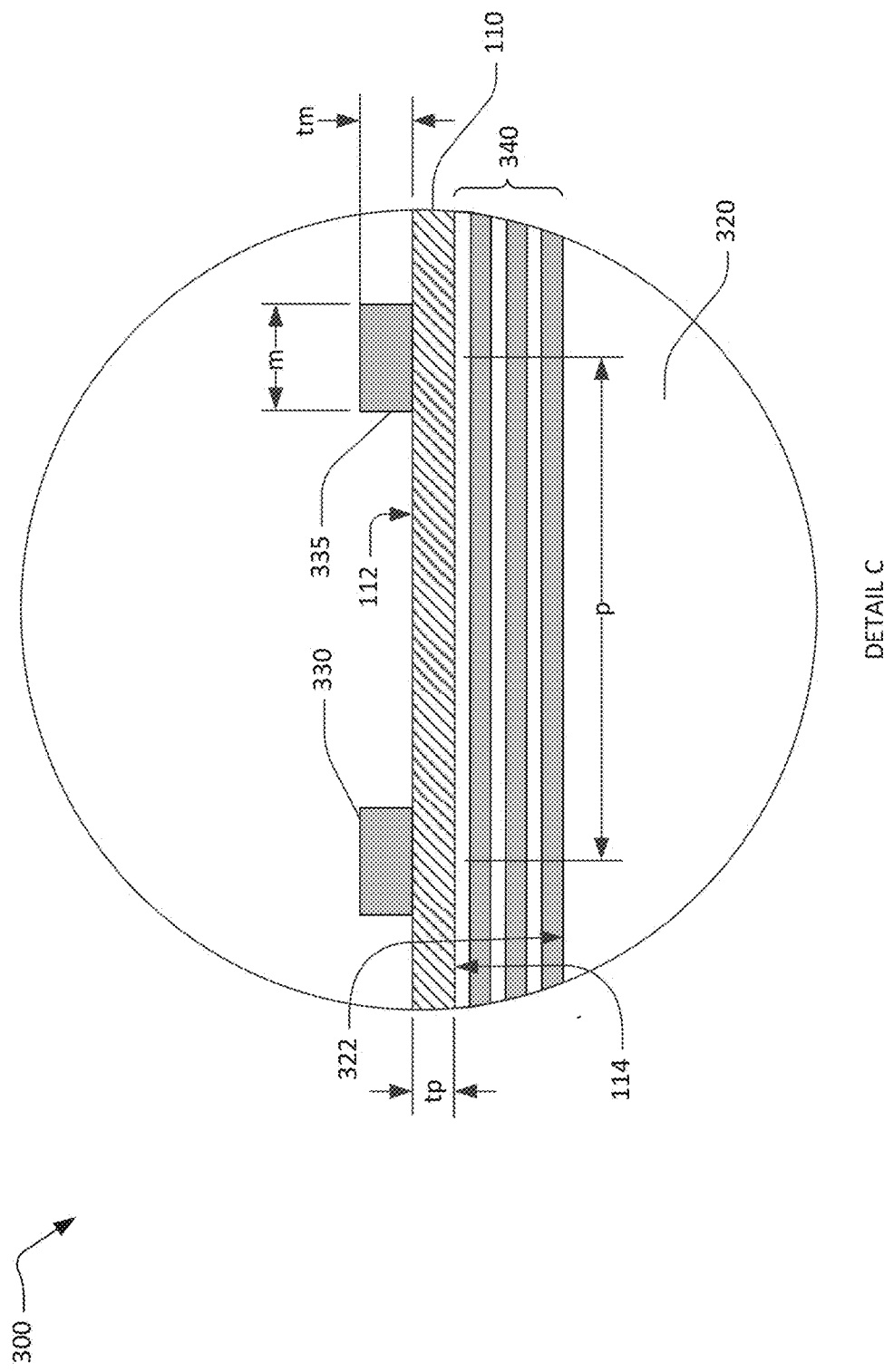
FIG. 3 is an alternative schematic cross-sectional view of an XBAR.

FIG. 3 shows a detailed schematic cross-sectional view of a solidly mounted XBAR (SM XBAR) 300. SM XBARs are first described in U.S. Pat. No. 10,601,392. The SM XBAR 300 includes a piezoelectric plate 110 and an IDT (of which only fingers 330 and 335 are visible). The piezoelectric layer 110 has parallel front and back surfaces 112, 114. Dimension tp is the thickness of the piezoelectric plate 110. The width of the IDT fingers 330, 335 is dimension m, thickness of the IDT fingers is dimension tm, and the IDT pitch is dimension p.

In contrast to the XBAR devices shown in FIG. 1 and FIG. 2, the IDT of an SM XBAR is not formed on a diaphragm spanning a cavity in a substrate (120 in FIG. 1). Instead, an acoustic Bragg reflector 340 is sandwiched between a surface 322 of a substrate 320 and the back surface 114 of the piezoelectric plate 110. The term "sandwiched" means the acoustic Bragg reflector 340 is both disposed between and mechanically attached to a surface 322 of the substrate 320 and the back surface 114 of the piezoelectric plate 110. In some circumstances, thin layers of additional materials may be disposed between the acoustic Bragg reflector 340 and the surface 322 of the substrate 320 and/or between the Bragg reflector 340 and the back surface 114 of the piezoelectric plate 110. Such additional material layers may be present, for example, to facilitate bonding the piezoelectric plate 110, the acoustic Bragg reflector 340, and the substrate 320.

The acoustic Bragg reflector 340 includes multiple dielectric layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As will be discussed subsequently, the primary acoustic mode in the piezoelectric plate of an XBAR is a shear bulk wave. Each of the layers of the acoustic Bragg reflector 340 has a thickness equal to, or about, one-fourth of the wavelength of a shear bulk wave having the same polarization as the primary acoustic mode at or near a resonance frequency of the SM XBAR 300. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide, and diamond. All of the high acoustic impedance layers of the acoustic Bragg reflector 340 are not necessarily the same material, and all of the low acoustic impedance layers are not necessarily the same material. In the example of FIG. 3, the acoustic Bragg reflector 340 has a total of six layers. An acoustic Bragg reflector may have more than, or less than, six layers.

As shown in FIG. 3, the IDT fingers 330, 335 have rectangular cross-sections. The IDT fingers 330, 335 may have some other cross-section, such as trapezoidal, T-shaped, or stepped. The IDT fingers 330, 335 are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be formed between the IDT fingers 330, 335 and the piezoelectric plate 110. Although not shown in FIG. 3, some or all IDT fingers may be disposed in grooves or slots extending partially or completely through the piezoelectric plate 110.

Figure 4:
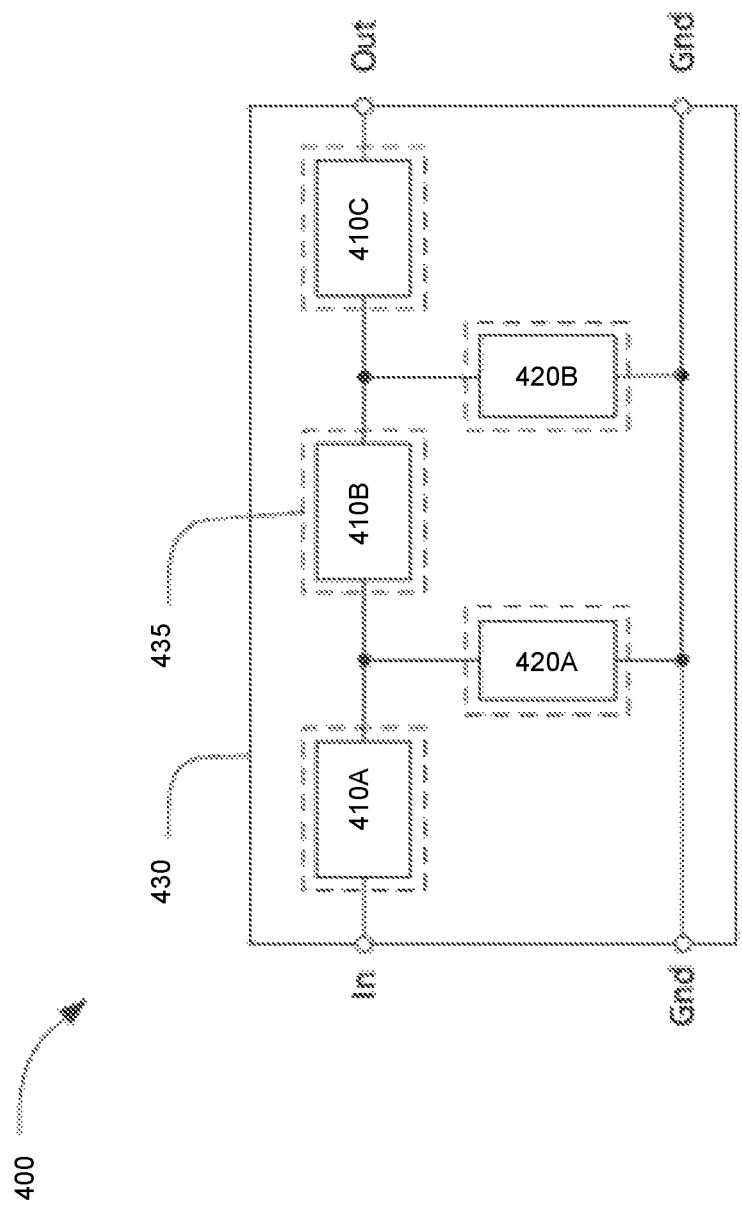
FIG. 4 is a schematic block diagram of a filter using XBARs.

FIG. 4 is a schematic circuit diagram for a high frequency band-pass filter 400 using XBARs. The filter 400 has a conventional ladder filter architecture including three series resonators 410A, 410B, 410C and two shunt resonators 420A, 420B. The three series resonators 410A, 410B, and 410C are connected in series between a first port and a second port (hence the term "series resonator"). In FIG. 4, the first and second ports are labeled "In" and "Out", respectively. However, the filter 400 is bidirectional and either port may serve as the input or output of the filter. The two shunt resonators 420A, 420B are connected from nodes between the series resonators to ground. A filter may contain additional reactive components, such as inductors, not shown in FIG. 4. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 400, the three series resonators 410A, B, C and the two shunt resonators 420A, B of the filter 400 are formed on a single plate 430 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 4, the cavities are illustrated schematically as the dashed rectangles (such as rectangle 435). In this example, each IDT is disposed over a respective cavity. In other filters, the IDTs of two or more resonators may be disposed over a single cavity.

Each of the resonators 410A, 410B, 410C, 420A, 420B in the filter 400 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 400. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Figure 5A:
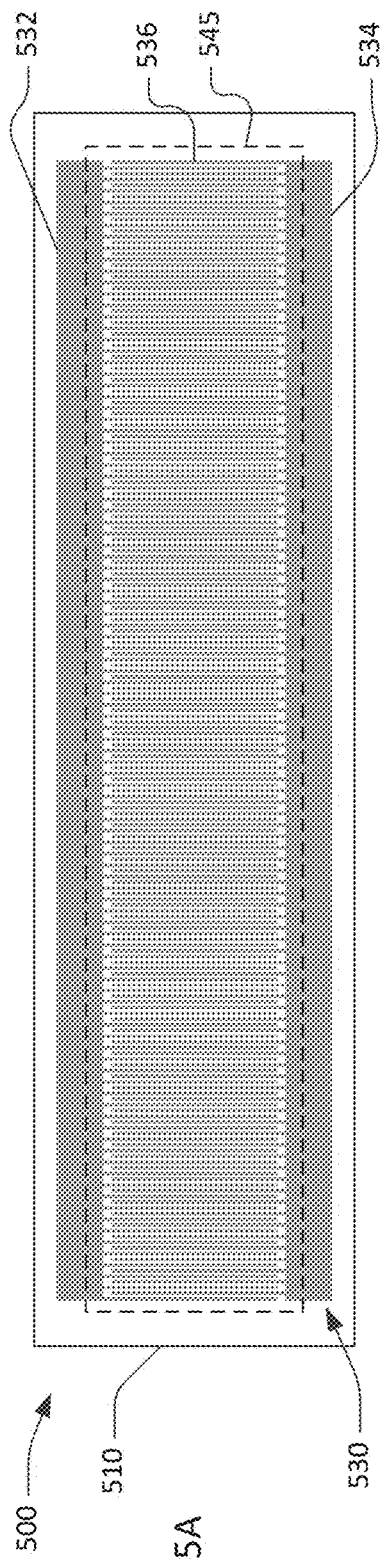
FIG. 5A is a plan view of IDT electrodes for an XBAR with 200 IDT fingers.

FIG. 5A is a plan view of an XBAR 500 including an IDT electrode pattern 530 on a surface of a piezoelectric plate 510. A portion of the piezoelectric plate forms a diaphragm spanning a cavity in a substrate (not visible) that supports the piezoelectric plate 510. The dashed line 545 represents the perimeter of the cavity. In this example, the perimeter of the cavity is rectangular but may have some other shape. The diaphragm is the area of the piezoelectric plate within the perimeter 545.

The IDT electrode pattern 530 includes a first bus bar 532, and second busbar 534, and a plurality of interleaved fingers (of which only finger 536 is identified) that extend alternately from the first and second busbars. The term "busbar" means a conductor to which a plurality of other conductors is connected. The interleaved fingers are disposed on the diaphragm portion of the piezoelectric plate. In this example, IDT electrode pattern 530 includes 200 interleaved fingers.

Figure 5B:
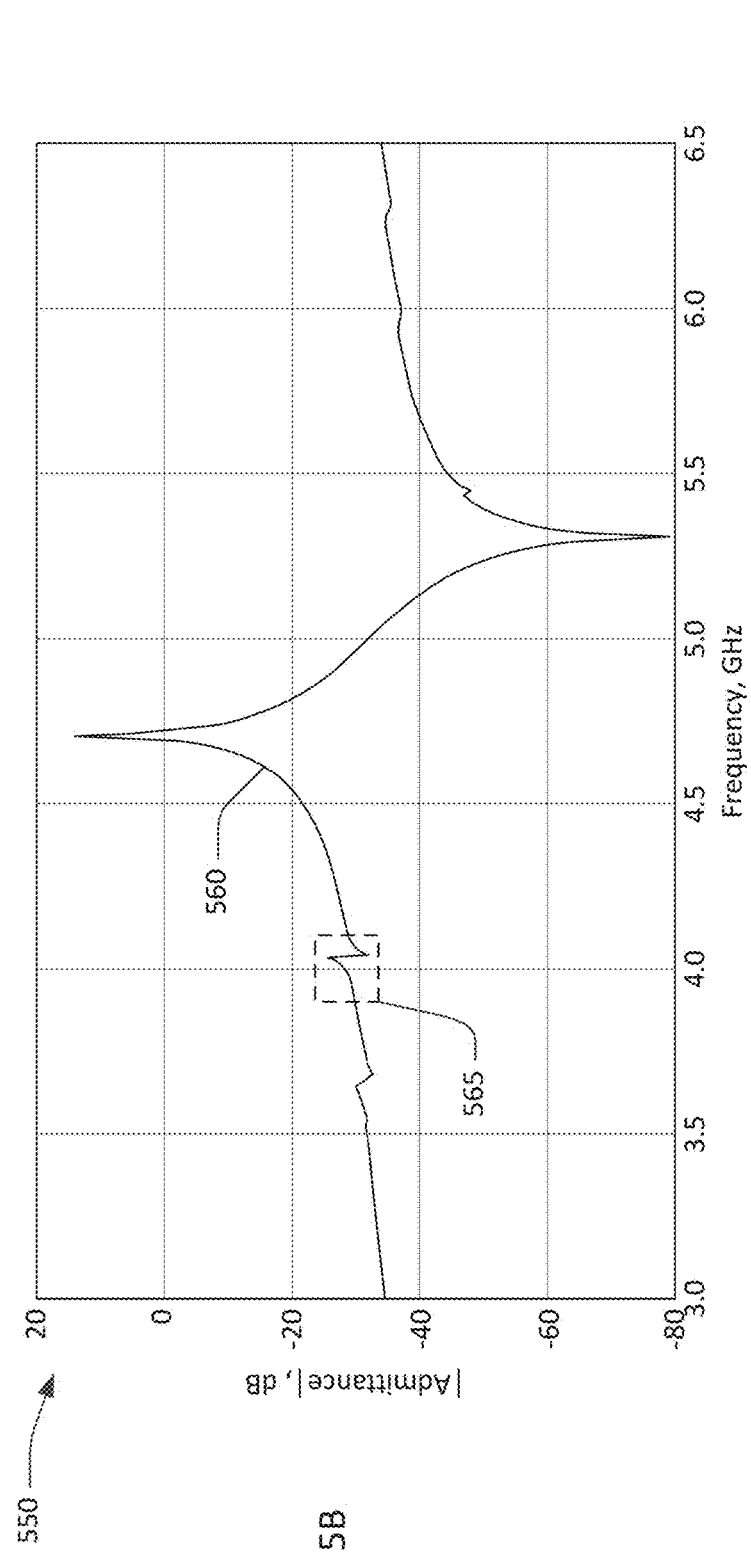
FIG. 5B is a graph of the magnitude of admittance as a function of frequency for an XBAR using the IDT electrodes of FIG. 5A.

FIG. 5B is a chart 550 showing the performance of the XBAR 500 of FIG. 5A. Specifically, the solid line 560 is a plot of the magnitude of the admittance, derived from simulation of the XBAR 500 using finite element methods, of the XBAR 500 as a function of frequency. The admittance curve 560 exhibits a resonance, where the admittance is maximum, at about 4.7 GHz and an anti-resonance, where the admittance in minimum, at about 5.3 GHz. The admittance curve 560 exhibits several artifacts including the resonance and anti-resonance of a spurious mode within the dashed box 565. This spurious mode is believed to be a harmonic of an S0 plate wave.

FIG. 6A is a plan view of an XBAR 600 partitioned into six smaller resonators 630-1 to 630-6 which will be referred to herein as "cells". As used in this patent, a "cell" is a small (but not necessarily the smallest) XBAR that meets a set of performance requirements that may include resonance frequency, anti-resonance frequency, and Q-factor. Each cell includes all of the normal elements of an XBAR—a piezoelectric diaphragm and an IDT including two busbars and interleaved fingers on the diaphragm. A cell may include additional elements, such as the reflector elements to be discussed subsequently, that are not necessarily found in an XBAR.

Multiple cells can be connected in parallel to provide an XBAR of any desired size. In FIG. 6A, each cell 630-1 to 630-6 includes a respective IDT electrode pattern on a surface of a piezoelectric plate 610. Each IDT has respective first and second busbars (of which only busbars 632-1 and 634-1 are identified) and a set of interleaved fingers extending from the busbars. The interleaved fingers of the IDT of each cell 630-1 to 630-6 are disposed on a respective diaphragm spanning a respective cavity in a substrate (not visible) that supports the piezoelectric plate 610. Perimeters of the cavities are indicated by dashed rectangles, of which only cavity 640-1 is identified. In this example, the perimeters of the cavities are rectangular but may have some other shape.

Solidly-mounted XBARs may also be partitioned into multiple cells, in which case there are no cavities under the piezoelectric plate. A continuous acoustic Bragg reflector may be between the piezoelectric plate and the substrate under all of the cells.

The cells 630-1 to 630-6 are electrically connected in parallel by conductors, represented schematically by conductor 635. In this example, the IDT of each cell 630-1 to 630-6 has 33 fingers, resulting in 198 total fingers across the six cells. The cells comprising and XBAR may typically, but not necessarily, have the same number of fingers. Although the cells 630-1 to 630-6 are shown in FIG. 6A arranged in a row, arrangement of the cells in a linear array is not necessary.

FIG. 6B is a plan view of another XBAR 650 partitioned into six cells 670-1 to 670-6. Each cell 670-1 to 670-6 includes a respective IDT electrode pattern on a surface of a piezoelectric plate 660. The busbars of the six cells 670-1 to 670-6 are segments of common first and second busbars 682 and 684. Each IDT includes a set of interleaved fingers extending from the busbars 682, 684. The interleaved fingers of the IDTs of each cell 630-1 to 630-6 are disposed on respective diaphragms spanning respective cavities in a substrate (not visible) that supports the piezoelectric plate 660. Perimeters of the cavities are indicated by dashed rectangles, of which only cavity 690-1 is identified. In this example, the perimeters of the cavities are rectangular but may have some other shape.

The cells 670-1 to 670-6 are electrically connected in parallel by the common busbars 682, 684. In this example, the IDT of each cell 670-1 to 670-6 has 33 fingers, resulting in 198 total fingers across the six cells. Additional wide fingers (not identified) may extend from one of the bus bars between the cavities to remove heat from the area of the diaphragms.

Assuming XBAR 500 of FIG. 5A, XBAR 600 of FIG. 6A, and XBAR 650 of FIG. 6B have the same piezoelectric plate thickness, material, and crystal orientation and the same IDT pitch and mark, the XBARs 500, 600, and 650 will have the same, or nearly the same, resonance frequency, anti-resonance frequency, and capacitance. However, the amplitude of at least some spurious modes may be substantially smaller for XBAR 600 and XBAR 650 compared to XBAR 500.

Figure 7:
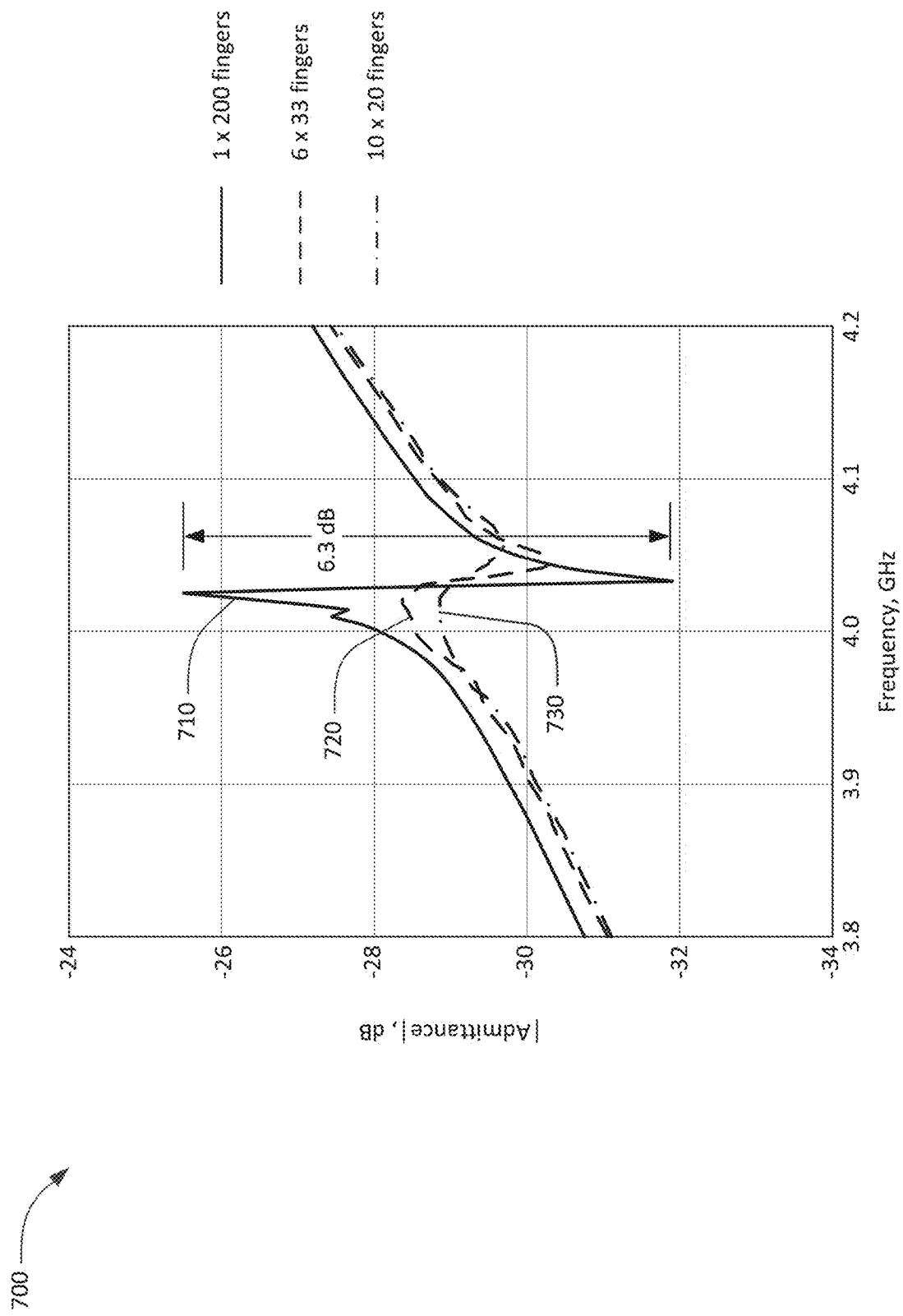
FIG. 7 is a graph comparing the magnitude of admittance as a function of frequency for three XBARs with different numbers of cells.

Although the coupling between an RF signal applied to an XBAR and any spurious mode is very small, spurious modes that propagate along the length of an XBAR may be reinforced by the small, but finite, reflections that occur at each IDT finger, resulting in a nonlinear relationship between the amplitude of a spurious mode and the number of IDT fingers, as will be illustrated in FIG. 7.

FIG. 7 is chart showing an expansion of the area 565 identified in FIG. 5B. Specifically, the solid curve 710 is a plot of the admittance of the XBAR 500 of FIG. 5A, which has 200 IDT fingers, as a function of frequency. The dashed line 720 is a plot of the admittance of the XBAR 600 of FIG. 6A, which has 198 IDT fingers divided into 6 cells with 33 fingers per cell. The dot-dash line 730 is a plot of the admittance of another XBAR with 200 IDT fingers divided into ten cells with 20 fingers per cell. The frequencies of the resonance and anti-resonance of the three XBARs are essentially the same. All data was determined by simulation of the XBARs using finite element methods.

In the example of FIG. 7, the amplitude (peak-to-peak admittance change) of the spurious mode is about 6.3 dB for the XBAR with 200 fingers (solid line 710). Dividing the XBAR into six cells with 33 fingers per cell reduces the amplitude to about 2 dB (dashed line 720). Dividing the XBAR into ten cells with 20 fingers per cell reduces the amplitude to less than 1 dB (dot-dash line 730).

Reducing the number of fingers in the IDT of an XBAR may lower the Q-factor. Possible loss mechanisms in an acoustic resonator include resistive losses in the IDT and other conductors; viscous or acoustic losses in the piezoelectric plate, IDT fingers, and other materials; and leakage of acoustic energy out of the resonator structure. The peak energy stored in a resonator is proportional the capacitance of the resonator. In an XBAR resonator, the capacitance is approximately proportional to the number of IDT fingers. Resistive losses and viscose losses are also approximately proportional to the number of IDT fingers. Acoustic energy that leaks from the resonator in the transverse direction (i.e., the direction parallel to the IDT fingers) is proportional to the length of the resonator and thus also approximately proportional to the number of IDT fingers. In contrast, energy lost from the ends of the IDT in the longitudinal direction (i.e., the direction normal to the IDT fingers) is roughly constant, independent of the number of IDT fingers. As the number of IDT fingers and the peak energy stored in an XBAR is reduced, the acoustic energy lost in the longitudinal direction, although small, becomes an ever-increasing fraction of the peak energy stored.

Figure 8:
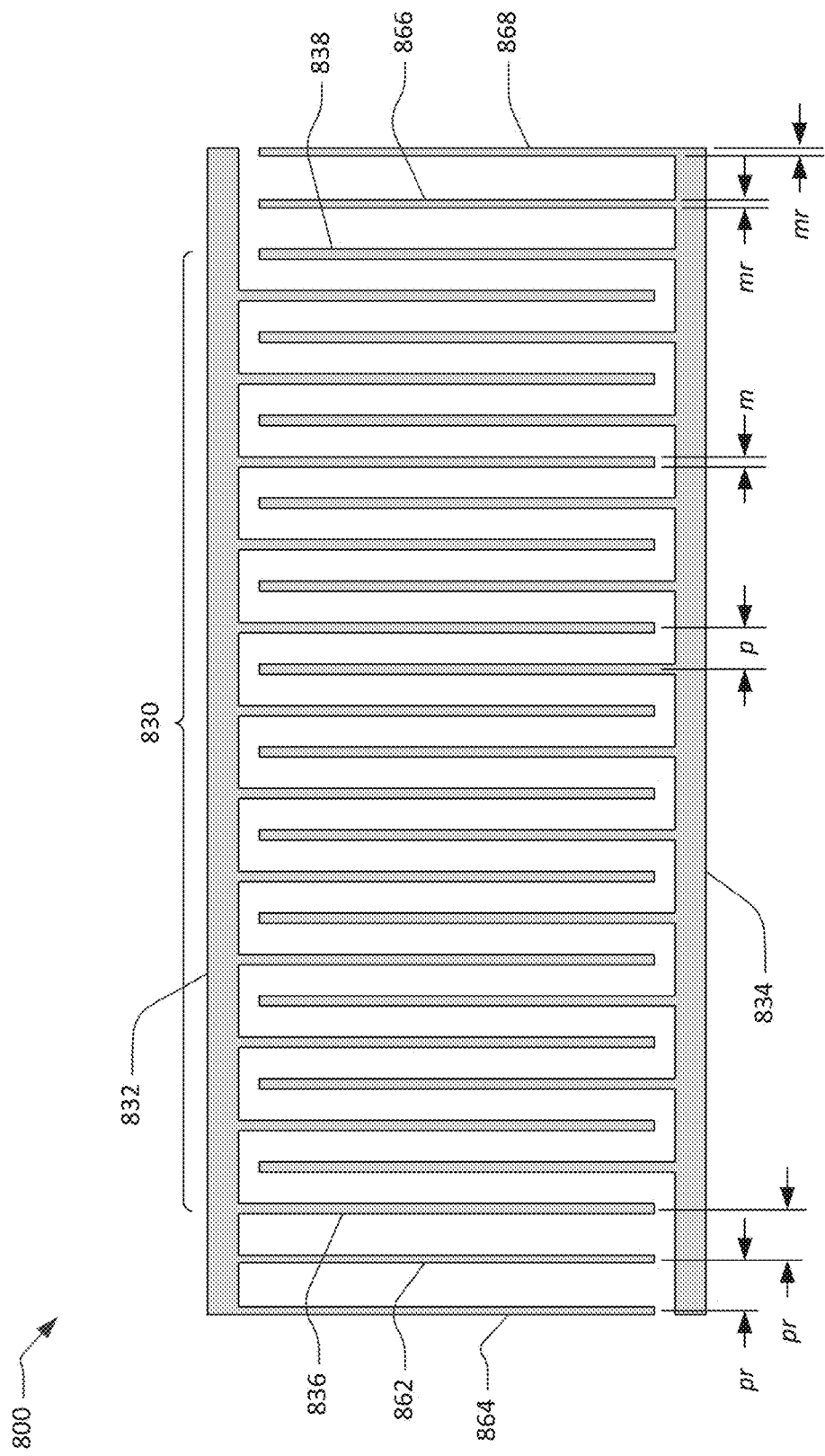
FIG. 8 is a plan view of an IDT electrode pattern with reflector elements.

FIG. 8 is a plan view of an exemplary conductor pattern 800 for a cell with reduced acoustic energy leakage in the longitudinal direction at the ends of the cell. The conductor pattern 800 includes an IDT 830 and four reflector elements 862, 864, 866, 868 as described in co-pending patent application Ser. No. 17/229,767. The IDT 830 includes a first busbar 832, a second busbar 834, and a plurality of n interleaved IDT fingers extending alternately from the first and second busbars. In this example, n, the number of IDT fingers, is equal to 24. In other XBARs, n may be in a range from 20 to 100 or more IDT fingers. IDT finger 836 is the $1^{st}$ finger and IDT finger 838 is the last or n'th finger. Numbering the IDT fingers from left to right (as shown in FIG. 8) is arbitrary and the designations of the $1^{st}$ and n'th fingers could be reversed. The $1^{st}$ and n'th fingers may be collectively referred to as the "terminal" fingers.

As shown in FIG. 8, the odd numbered IDT fingers extend from the first busbar 832 and the even numbered IDT fingers extend from the second busbar 834. The IDT 830 has an even number of IDT fingers such that the $1^{st}$ and n'th IDT fingers 836, 838 extend from different busbars. In some cases, an IDT may have an odd number of IDT fingers such that the $1^{st}$ and n'th IDT fingers and all of the reflector elements extend from the same busbar.

A total of four reflector elements are provided outside of periphery of the IDT 830. A first reflector element 862 is proximate and parallel to 1st IDT finger 836 at the left end (as seen in the figure) of the IDT 830. A second reflector element 866 is proximate and parallel to n'th IDT finger 838 at the right end of the IDT 830. An optional third reflector element 864 is parallel to the first reflector element 862. An optional fourth reflector element 868 is parallel to the second reflector element 866.

First and third reflector elements 862, 864 extend from the first busbar 832 and thus are at the same electrical potential as the 1st IDT finger 836. Similarly, second and fourth reflector elements 866 and 868 extend from the second busbar 830 and thus are at the same electrical potential as the n'th IDT finger 838. In other embodiments, reflector elements may be connected to the other busbar (i.e. the busbar that the $1^{st}$ and n'th IDT fingers are not connected to) such that the reflector elements are at the opposite electrical potential from the $1^{st}$ and n'th IDT fingers.

The reflector elements 862, 864, 866, 868 are configured to confine acoustic energy to the area of the IDT 830 and thus reduce acoustic energy losses in the longitudinal direction. To this end, the pitch pr between adjacent reflector elements and between reflector elements 862 and 866 and the adjacent first and n'th IDT fingers, respectively, is typically greater than the pitch p of the IDT fingers. The width or mark mr of the reflector elements 862, 864, 866, 868 is not necessarily equal to the mark m of the IDT fingers. As described in application Ser. No. 17/229,767, the mark mr of the reflector elements may be selected to optimize Q-factor at a specific frequency or range of frequencies.

Figure 9:
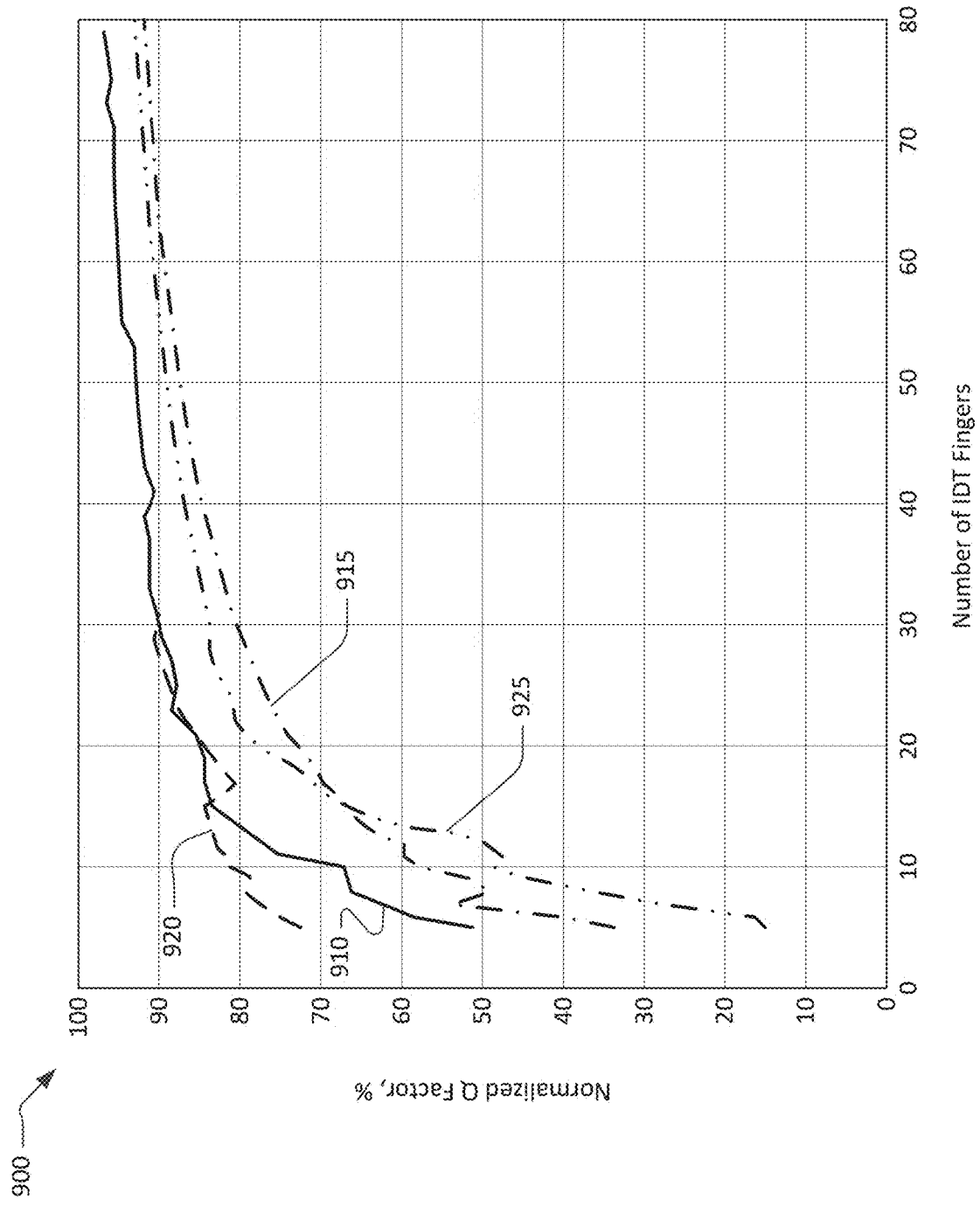
FIG. 9 is a graph of the normalized Q-factor as a function of the number of IDT fingers in a cell.

FIG. 9 is a graph 900 of the normalized Q-factor as a function of number of IDT fingers for XBARs with two optimized reflector elements at each side of the IDT, similar to the reflector elements shown in FIG. 8. "Normalized Q-factor" is the Q-factor of the XBAR with a finite number of IDT fingers divided by the Q-factor of a hypothetical XBAR with the same structure and an infinite number of IDT fingers. Specifically, the solid curve 910 is a plot of the normalized Q-factor of an XBAR with reflector elements at its anti-resonance frequency. The dot-dash curve 915 is a plot of the normalized Q-factor of a similar XBAR without reflector elements at its anti-resonance frequency. The dashed curve 920 is a plot of the normalized Q-factor of the XBAR with reflector elements at its resonance frequency. The dot-dot-dash curve 925 is a plot of the normalized Q-factor of a the XBAR without reflector elements at its resonance frequency. All data is determined by simulation of XBARs using finite element methods.

FIG. 9 shows that an IDT with 30 fingers and reflector elements provides a normalized Q-factor of 90% at either the resonance or anti-resonance frequencies. Note that the optimum reflector elements are different for the resonance and anti-resonance frequencies. Since a normalized Q-factor of 90% is not necessarily required for all XBARs in all filters, cells may have as few as 15 fingers and typically will not have more than 35 fingers.

Figure 10:
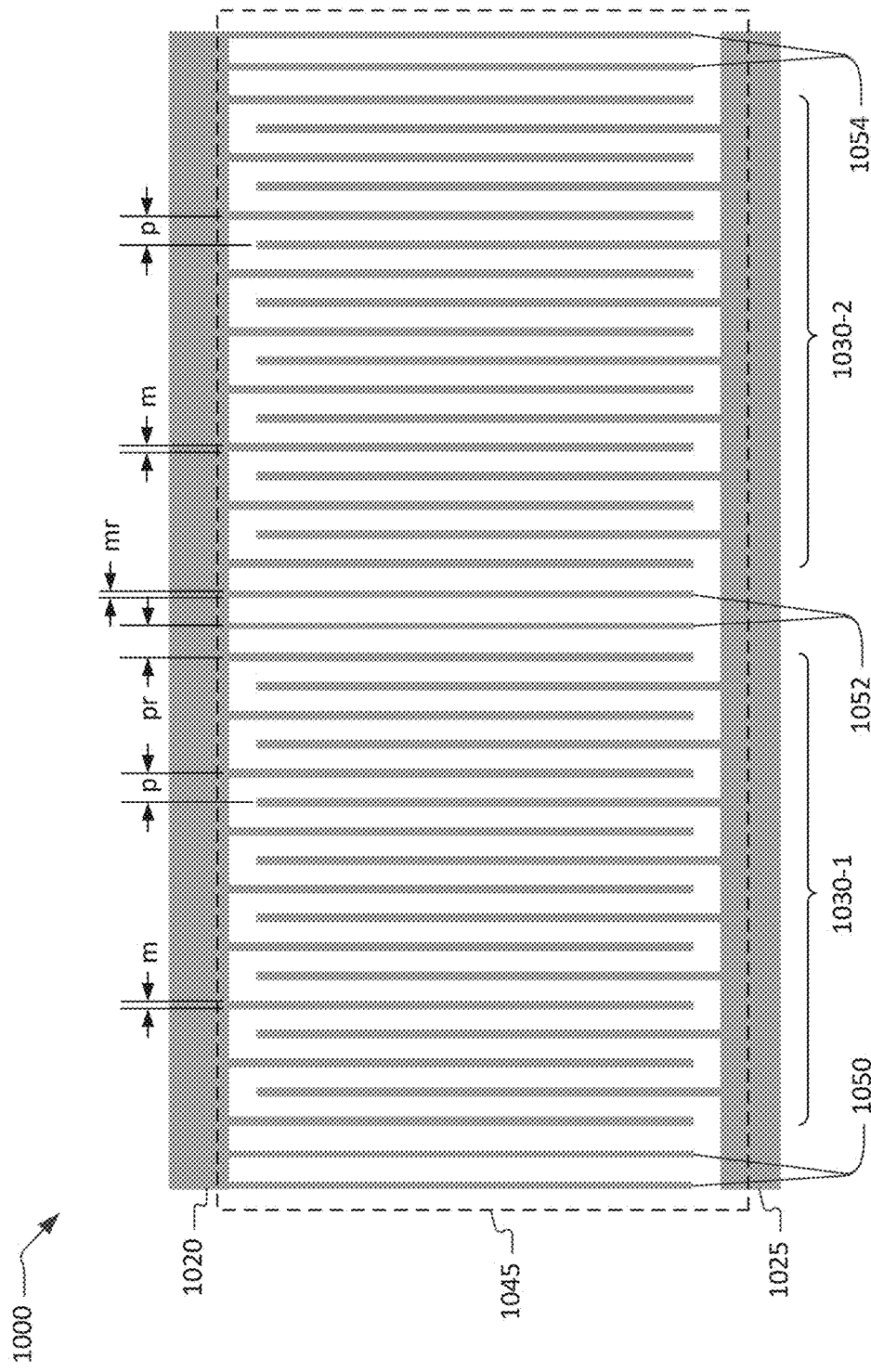
FIG. 10 is a plan view of an IDT electrode pattern with two cells separated by reflector fingers.

FIG. 10 is a plan view of a conductor pattern 1000 for an XBAR with two cells disposed on a common piezoelectric diaphragm that spans a common cavity. The dashed line 1045 represents a perimeter of the cavity, which is to say the intersection of the cavity and back side of the piezoelectric plate. In this example the perimeter of the cavity is rectangular but may have some other shape.

The conductor pattern 1000 includes a first busbar 1020 and a second busbar 1025 that are common to both cells. The first cell 1030-1 has 17 interleaved IDT fingers extending alternately from the first and second busbars 1020, 1025. The number of IDT fingers was chosen for ease of representation. A cell may commonly have more than 17 fingers and may have less than 17 fingers. A cell may typically have not more than 35 fingers. The second cell 1030-2 also has 17 interleaved IDT fingers extending alternately from the first and second busbars 1020, 1025.

In this example, the IDT fingers of both the first cell 1030-1 and the second cell 1030-2 have the same pitch p and the same mark m. However, the pitch and mark of the IDT elements of different cells are not necessarily the same. A small difference in pitch and/or mark between cells may further reduce the amplitude of spurious modes. For example, the IDT fingers of the first cell 1030-1 may have pitch p1 and mark m1 and the IDT fingers of the second cell 1030-2 may have pitch p2 and mark m2, where p1≠p2 and/or m1≠m2.

The 17 IDT fingers of the first cell 1030-1 are disposed between a first pair of reflector elements 1050 and a second pair of reflector elements 1052. The 17 IDT fingers of the second cell 1030-2 are disposed between the second pair of reflector elements 1052 and a third pair of reflector elements 1054. The first cell 1030-1 and the second cell 1030-2 effectively share the second pair of reflector elements 1052.

The reflector elements 1050, 1052, 1054 are configured to reduce leakage of acoustic energy from the cells. To this end, the pitch pr between adjacent reflector elements and between reflector elements and adjacent IDT fingers is typically greater than the pitch p of the IDT fingers. The mark mr of the reflector elements may less than, equal to, or greater than the mark m of the IDT fingers.

In the example of FIG. 10, a pair of reflector elements 1050, 1052, 1054 are positioned at the ends of each of the cells 1030-1 and 1030-2. As described in co-pending patent application Ser. No. 17/229,767, in some circumstances a single reflector element may be used, and there is little benefit in having more than two reflector elements at the ends of the IDT of an XBAR. Since the reflector elements 1050, 1052, 1054 are configured to reduce leakage of acoustic energy, the cells 1030-1, 1030-2 are substantially acoustically isolated from each other.

Figure 11:
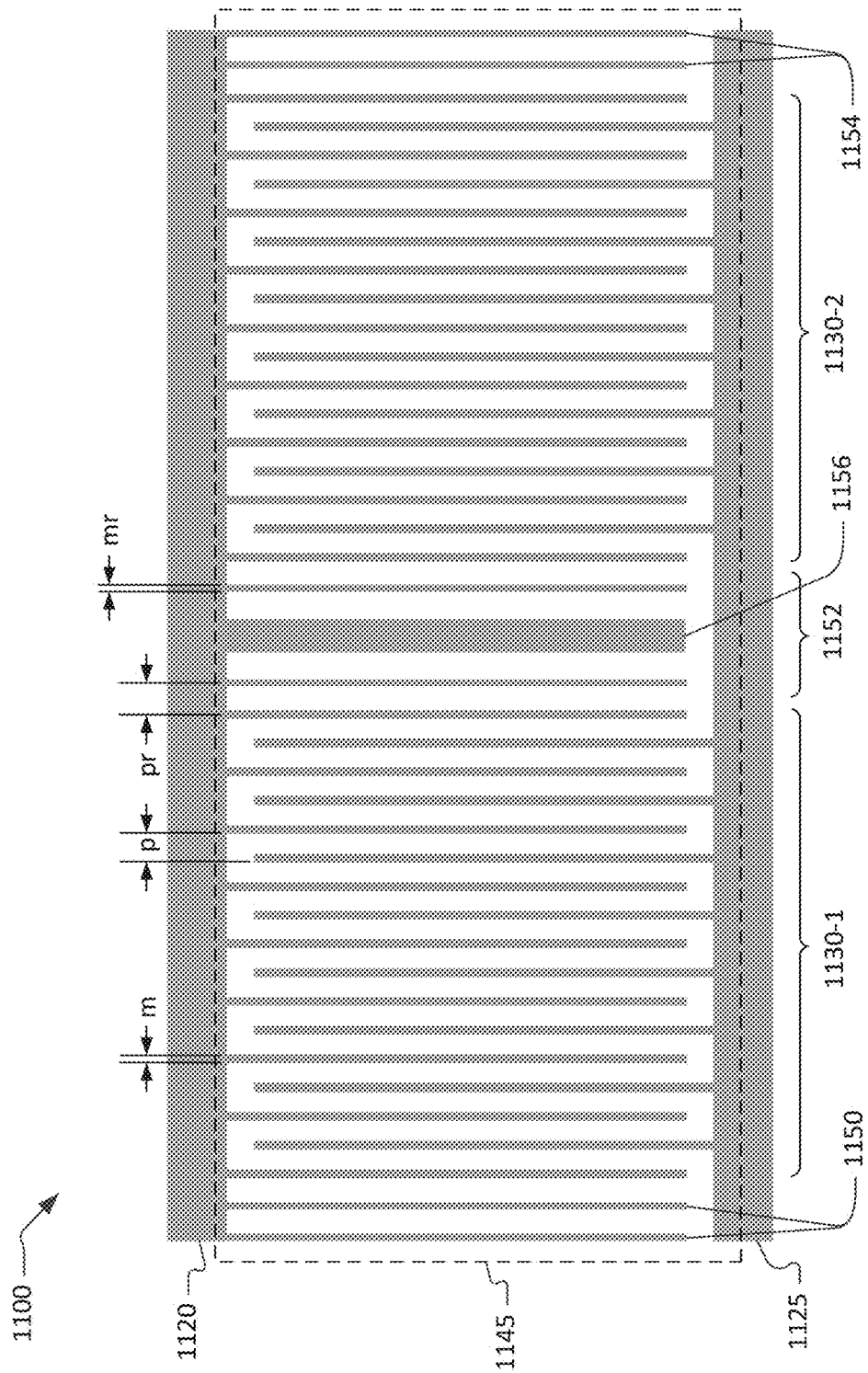
FIG. 11 is a plan view of an IDT electrode pattern with two cells separated by reflector fingers with enhanced heat removal.

FIG. 11 is a plan view of a conductor pattern 1100 for another XBAR with two cells disposed on a common piezoelectric diaphragm that spans a common cavity. The dashed line 1145 represents a perimeter of the cavity, which is to say the intersection of the cavity and back side of the piezoelectric plate. In this example the perimeter of the cavity is rectangular but may have some other shape.

The conductor pattern 1100 includes a first busbar 1120 and a second busbar 1125 that are common to both cells. The first cell 1130-1 has 17 interleaved IDT fingers extending alternately from the first and second busbars 1120, 1125. As in the previous example, the number of IDT fingers was chosen for ease of representation. The second cell 1130-2 also has 17 interleaved IDT fingers extending alternately from the first and second busbars 1120, 1125.

In this example, the IDT fingers of both the first cell 1130-1 and the second cell 1030-2 have the same pitch p and the same mark m. As previously described, the pitch and mark of the IDT elements of different cells are not necessarily the same.

The 17 IDT fingers of the first cell 1130-1 are disposed between a first pair of reflector elements 1150 and a group 1152 of three reflector elements. The 17 IDT fingers of the second cell 1130-2 are disposed between the group 1152 of three reflector elements and a second pair of reflector elements 1154. The first cell 1130-1 and the second cell 1130-2 effectively share the group 1152 of three reflector elements.

The reflector elements 1150, 1152, 1154 are configured to reduce leakage of acoustic energy from the cells as previously described. The middle element 1156 of the group 1152 of three reflector elements may be a heat sink finger with a substantially wider mark and/or substantially greater thickness than the other two reflector elements of the group. The heat sink finger 1156 may facilitate removing heat from diaphragm.

Figure 12:
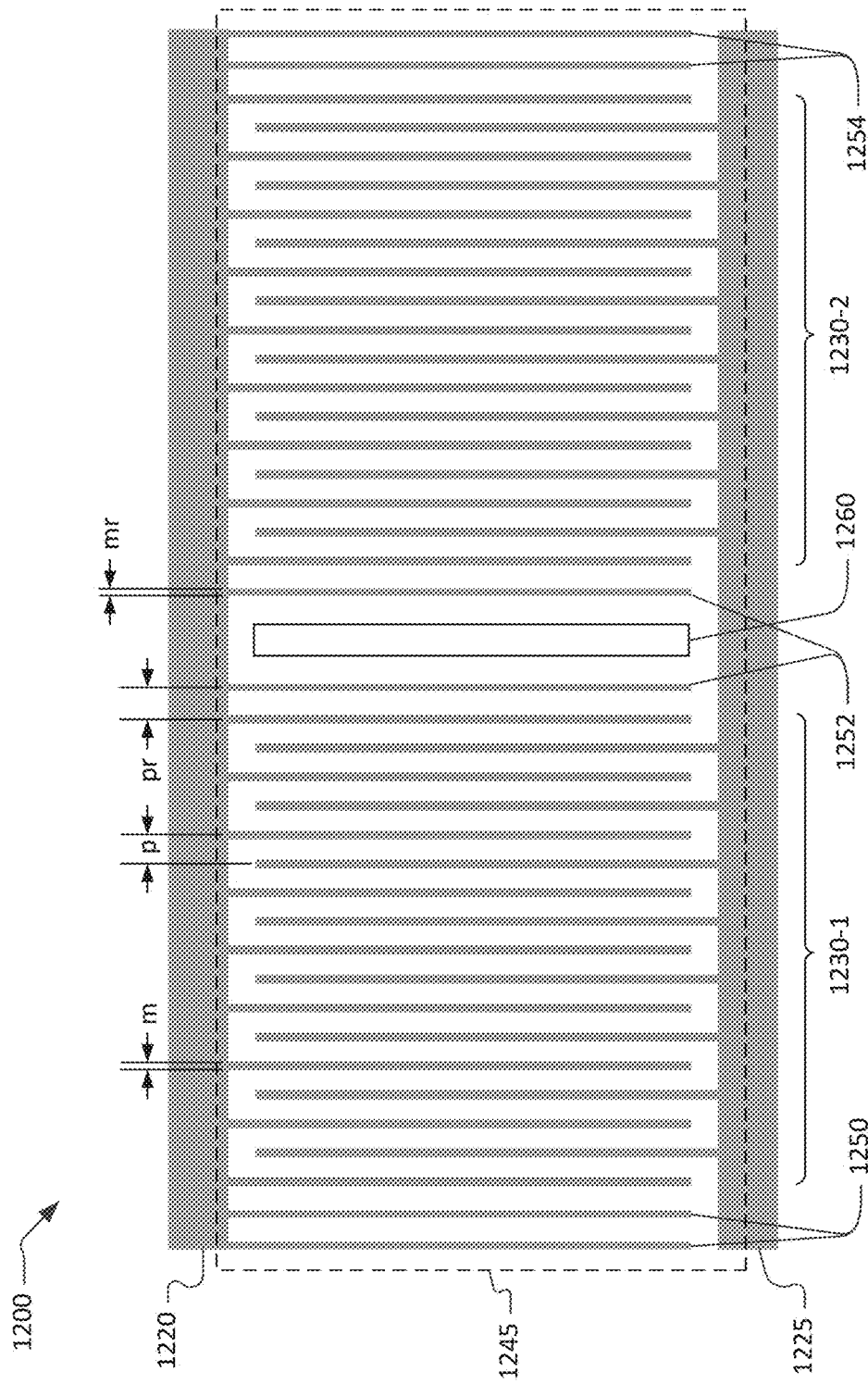
FIG. 12 is a plan view of an IDT electrode pattern with two cells separated by reflector fingers and an opening through the piezoelectric plate.

FIG. 12 is a plan view of a conductor pattern 1200 for another XBAR with two cells disposed on a common piezoelectric diaphragm that spans a common cavity. The dashed line 1245 represents a perimeter of the cavity, which is to say the intersection of the cavity and back side of the piezoelectric plate. In this example the perimeter of the cavity is rectangular but may have some other shape.

The conductor pattern 1200 includes a first busbar 1220 and a second busbar 1225 that are common to both cells. The first cell 1230-1 has 17 interleaved IDT fingers extending alternately from the first and second busbars 1220, 1225. As in the previous examples, the number of IDT fingers was chosen for ease of representation. The second cell 1230-2 also has 17 interleaved IDT fingers extending alternately from the first and second busbars 1220, 1225.

In this example, the IDT fingers of both the first cell 1230-1 and the second cell 1230-2 have the same pitch p and the same mark m. As previously described, the pitch and mark of the IDT elements of different cells are not necessarily the same.

The 17 IDT fingers of the first cell 1230-1 are disposed between a first pair of reflector elements 1250 and a second pair of two reflector elements 1252. The 17 IDT fingers of the second cell 1230-2 are disposed between the second pair of reflector elements 1252 and a third pair of reflector elements 1254. The first cell 1230-1 and the second cell 1230-2 effectively share the second pair of reflector elements 1252.

The reflector elements 1250, 1252, 1254 are configured to reduce leakage of acoustic energy from the cells as previously described. The second pair of reflector elements 1252 are separated by an opening 1260 that passes thought the diaphragm. In this example, the opening 1260 is a rectangular slot, but may have some other shape, such as an array of circular or square holes. The opening 1260 may provide a passage for an etchant used to form the cavity behind the piezoelectric plate.

The examples 1000, 1100, and 1200 of FIG. 10, FIG. 11, and FIG. 12 respectively, all show two cells on a common diaphragm that spans a common cavity. However, there may be more or fewer than two cells on a common diaphragm. For example, an XBAR partitioned into six cells may comprise six diaphragms with one cell per diaphragm (as shown in FIG. 6A and FIG. 6B), three diaphragms with two cells per diaphragm (as shown in FIG. 10), two diaphragms with three cells per diaphragm, or one diaphragm with all six cells. In all cases, each diaphragm spans a respective cavity. An XBAR may be partitioned into more or fewer than six cells. An XBAR may be partitioned into n cells, where n is an integer greater than one, which may be arranged on one to n diaphragms.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. An acoustic resonator device comprising:
a plurality of cells electrically connected in parallel, each cell comprising:
an interdigital transducer (IDT) on a portion of a piezoelectric plate, the IDT having at least 15 and not more than 35 interleaved fingers; and
a heat sink finger between at least two adjacent cells.

2. The device of claim 1, wherein the piezoelectric plate and the IDT of each of the plurality of cells are configured such that a radio frequency signal applied to the IDT excites a shear primary acoustic mode in the piezoelectric plate.

3. The device of claim 1, wherein each cell further comprises one or more reflector elements proximate and parallel to each terminal finger of the IDT.

4. The device of claim 1, wherein each cell further comprises two reflector elements proximate and parallel to each terminal finger of the IDT.

5. The device of claim 1, wherein the piezoelectric plate comprises one or more diaphragms spanning respective cavities in a substrate.

6. The device of claim 5, wherein the interleaved fingers of the IDT of each of the plurality of cells are on respective diaphragms.

7. The device of claim 5, wherein the interleaved fingers of IDTs of two or more of the plurality of cells are on a common diaphragm.

8. The device of claim 7, wherein the interleaved fingers of IDTs of all of the plurality of cells are on a single piezoelectric diaphragm.

9. The device of claim 7, further comprising reflector elements between adjacent cells on the common diaphragm that are shared by the adjacent cells.

10. The device of claim 1, further comprising an acoustic Bragg reflector between a back surface of the piezoelectric plate and a substrate, wherein IDTs of the plurality of cells are on a front surface of the piezoelectric plate.

11. The device of claim 1, further comprising an acoustic Bragg reflector between a back surface of the piezoelectric plate and a substrate, wherein IDTs of the plurality of cells are on a front surface of the piezoelectric plate.

12. An acoustic resonator device comprising: a plurality of cells electrically connected in parallel, wherein at least some cells are adjacent, each cell comprising: an interdigital transducer (IDT) on a portion of a piezoelectric plate, the IDT having at least 15 and not more than 35 interleaved fingers; and at least one opening between respective adjacent cells,
wherein the piezoelectric plate comprises one or more diaphragms spanning respective cavities in a substrate, and
wherein the opening passes through a diaphragm of the one or more diaphragms.

13. The device of claim 12, wherein the piezoelectric plate and the IDT of each of the plurality of cells are configured such that a radio frequency signal applied to the IDT excites a shear primary acoustic mode in the piezoelectric plate.

14. The device of claim 12, wherein each cell further comprises one or more reflector elements proximate and parallel to each terminal finger of the IDT.

15. The device of claim 12, wherein each cell further comprises two reflector elements proximate and parallel to each terminal finger of the IDT.

16. The device of claim 12, wherein the interleaved fingers of the IDT of each of the plurality of cells are on respective diaphragms.

17. The device of claim 12, wherein the interleaved fingers of IDTs of two or more of the plurality of cells are on a common diaphragm.

18. The device of claim 17, wherein the interleaved fingers of IDTs of all of the plurality of cells are on a single piezoelectric diaphragm.

19. The device of claim 17, further comprising reflector elements between adjacent cells on the common diaphragm that are shared by the adjacent cells.

20. An acoustic resonator device comprising:
a plurality of cells electrically connected in parallel, each cell comprising:
a portion of a piezoelectric plate,
an interdigital transducer (IDT) on the portion of the piezoelectric plate, the IDT comprising interleaved fingers;
an acoustic isolation of each cell from the other cells; and
a heat sink finger between adjacent cells of the plurality of cells;
wherein the portion of the piezoelectric plate and the IDT of each of the plurality of cells are configured such that a radio frequency signal applied to the IDT excites a shear primary acoustic mode in the portion of the piezoelectric plate.

21. The device of claim 20, wherein each of the plurality of cells comprises a same number of interleaved fingers.

22. The device of claim 20, wherein each cell further comprises one or more reflector elements proximate and parallel to each terminal finger of the IDT.

23. The device of claim 22, further comprising reflector elements between adjacent cells that are shared by the adjacent cells.

24. The device of claim 20, wherein the portion of the piezoelectric plate is a diaphragm.

25. The device of claim 20, further comprising:
an acoustic Bragg reflector between a back surface of the piezoelectric plate and a substrate,
wherein IDTs of the plurality of cells are on a front surface of the piezoelectric plate.

26. An acoustic resonator device comprising:
a plurality of cells electrically connected in parallel, each cell comprising:
a portion of a piezoelectric plate,
an interdigital transducer (IDT) on the portion of the piezoelectric plate, the IDT comprising interleaved fingers; and
an acoustic isolation of each cell from the other cells;
wherein the portion of the piezoelectric plate and the IDT of each of the plurality of cells are configured such that a radio frequency signal applied to the IDT excites a shear primary acoustic mode in the portion of the piezoelectric plate, and
wherein the portions of the piezoelectric plate of each of the plurality of cells are portions of the same piezoelectric plate, and the acoustic resonator device further comprises one or more openings through the piezoelectric plate between adjacent cells.

* * * * *